(12) United States Patent
Golov

(10) Patent No.: US 12,001,281 B2
(45) Date of Patent: *Jun. 4, 2024

(54) DEFERRED ERROR CODE CORRECTION WITH IMPROVED EFFECTIVE DATA BANDWIDTH PERFORMANCE

(71) Applicant: Micron Technology, Inc., Boise, ID (US)

(72) Inventor: Gil Golov, Backnang (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/192,030

(22) Filed: Mar. 4, 2021

(65) Prior Publication Data

US 2021/0191812 A1 Jun. 24, 2021

Related U.S. Application Data

(63) Continuation of application No. 16/353,962, filed on Mar. 14, 2019, now Pat. No. 10,956,262.

(51) Int. Cl.
*G06F 11/10* (2006.01)
*G06F 12/0804* (2016.01)
(Continued)

(52) U.S. Cl.
CPC ...... *G06F 11/1068* (2013.01); *G06F 12/0804* (2013.01); *G11C 29/52* (2013.01); *G06F 3/0656* (2013.01); *G06F 11/073* (2013.01); *G06F 11/1052* (2013.01); *G06F 2212/1032* (2013.01); *G06F 2212/608* (2013.01); *G11C 11/40607* (2013.01); *G11C 29/42* (2013.01); *G11C 2207/2245* (2013.01);
(Continued)

(58) Field of Classification Search
CPC .. G06F 3/0656; G06F 11/1068; G06F 11/073; G06F 11/1052; G06F 12/0804; G06F 2212/1032; G06F 2212/608; H03M 13/098; H03M 13/11; G11C 29/52; G11C 2211/4062; G11C 29/42; G11C 11/40607; G11C 2207/2245
See application file for complete search history.

(56) References Cited

U.S. PATENT DOCUMENTS 7,200,780 B2  4/2007  Kushida
7,644,341 B2  1/2010  Huang
(Continued)

OTHER PUBLICATIONS

International Search Report and Written Opinion, PCT/US2020/020775, dated Jun. 5, 2020.

*Primary Examiner* — April Y Blair
*Assistant Examiner* — Sazzad Hossain
(74) *Attorney, Agent, or Firm* — Greenberg Traurig

(57) ABSTRACT

A deferred error correction code (ECC) scheme for memory devices is disclosed. In one embodiment, a method is disclosed comprising starting a deferred period of operation of a memory system in response to detecting the satisfaction of a condition; receiving an operation during the deferred period, the operation comprising a read or write operation access one or more memory banks of the memory system; deferring ECC operations for the operation; executing the operation; detecting an end of the deferred period of operation; and executing the ECC operations after the end of the deferred period.

20 Claims, 4 Drawing Sheets

(51) Int. Cl.
*G11C 29/52* (2006.01)
*G06F 3/06* (2006.01)
*G06F 11/07* (2006.01)
*G11C 11/406* (2006.01)
*G11C 29/42* (2006.01)
*H03M 13/09* (2006.01)
*H03M 13/11* (2006.01)

(52) U.S. Cl.
CPC ... *G11C 2211/4062* (2013.01); *H03M 13/098* (2013.01); *H03M 13/11* (2013.01)

(56) References Cited

U.S. PATENT DOCUMENTS

| | | | |
|---|---|---|---|
| 9,208,019 B2 | 12/2015 | Mirichigni | |
| 10,956,262 B2* | 3/2021 | Golov | G06F 12/0875 |
| 2002/0099995 A1* | 7/2002 | Furukawa | G11C 29/42 |
| | | | 714/766 |
| 2005/0036371 A1 | 2/2005 | Kushida | |
| 2008/0072117 A1* | 3/2008 | Syzdek | G11C 16/3454 |
| | | | 714/763 |
| 2012/0036400 A1* | 2/2012 | Miller | G06F 11/10 |
| | | | 714/54 |
| 2014/0195867 A1* | 7/2014 | Gollub | G11C 29/42 |
| | | | 714/719 |
| 2015/0293813 A1 | 10/2015 | Lin et al. | |
| 2018/0232277 A1* | 8/2018 | Nelogal | G06F 12/0804 |
| 2018/0336092 A1 | 11/2018 | Kim | |
| 2019/0229753 A1* | 7/2019 | Cha | G06F 11/1048 |
| 2020/0293396 A1 | 9/2020 | Golov | |

* cited by examiner

DEFERRED ERROR CODE CORRECTION WITH IMPROVED EFFECTIVE DATA BANDWIDTH PERFORMANCE

CROSS-REFERENCE TO RELATED APPLICATIONS

The present application is a continuation application of U.S. patent application Ser. No. 16/353,962, filed Mar. 14, 2019, issued as U.S. Pat. No. 10,956,262 on Mar. 23, 2021, and entitled "Deferred Error Code Correction With Improved Effective Data Bandwidth Performance," the disclosure of which application is hereby incorporated by reference herein in its entirety.

COPYRIGHT NOTICE

This application includes material that may be subject to copyright protection. The copyright owner has no objection to the facsimile reproduction by anyone of the patent disclosure, as it appears in the Patent and Trademark Office files or records, but otherwise reserves all copyright rights whatsoever.

BACKGROUND

Dynamic random-access memory (DRAM) devices are commonly used in nearly all computing systems to provide high-speed access to data used by one or more processors. Some DRAM devices utilize an error correction code (ECC) scheme, such as hamming codes, for ensuring the integrity of data during reads and writes. The use of ECCs allows a DRAM device to detect and, in some cases, correct errors in the data read/written from the underlying memory structures.

An ECC-enabled DRAM controller—typically located inside a system-on-a-chip (SoC)—generates an ECC parity bits and stores the parity bits along with the data in the DRAM data storage. A DRAM device implementing an ECC scheme can implement an inline or out-of-band (OOB) ECC scheme. In an inline scheme, the DRAM controller stores the ECC parity bits as a payload during reads/writes and does not require additional DRAM chips. In contrast, an OOB ECC scheme requires a dedicated DRAM chip (e.g., bank) for storing ECC parity bits.

During reads, a DRAM controller reads the ECC parity bits from the data (e.g., from a portion of the data stored in memory when using an inline scheme). The controller checks for data errors by generating an ECC syndrome based on the read data and compares it to stored ECC syndromes, a match indicating an error.

The above system suffers from the disadvantage of placing a bandwidth penalty due to the fact that some of the data bandwidth between DRAM and SoC is used for delivering the ECC parity bits as payload. The disclosed embodiments solve these and other problems in the art.

BRIEF DESCRIPTION OF THE FIGURES

The preceding and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

To improve the operation of a memory system employing an inline ECC scheme, the disclosed embodiments provide mechanisms for deferring ECC operations during memory read and write operations. The disclosed embodiments methods and devices start and stop a deferred period of operation (where ECC operations are suspended) in response to pre-configured triggers. When ECC operations are deferred, memory is read/written without transferring ECC data between a controller and a memory bank (or between the controller and a host processor). When the deferred period ends, the methods and devices perform the deferred ECC operations and alert the host processor on detecting ECC errors. In this manner, bus utilization is dedicated exclusively to user data, improving the overall bandwidth of the memory system and overall computing system employing the memory system.

Figure 1:
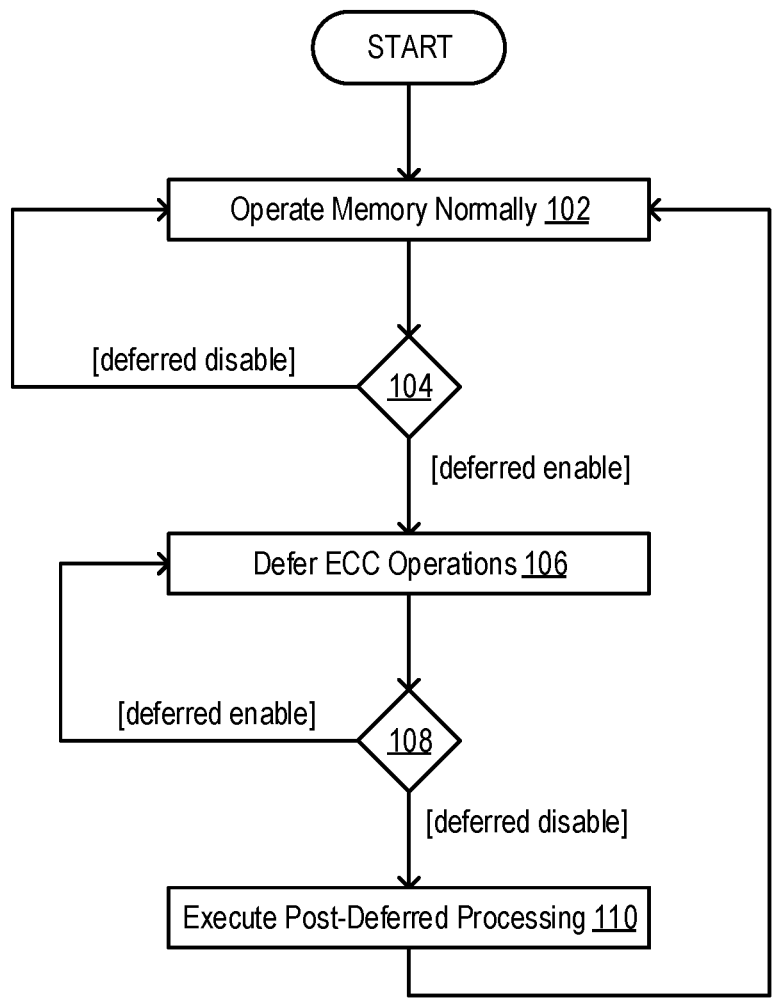
FIG. 1 is a flow diagram illustrating a method for deferring ECC operations in a memory system according to some embodiments of the disclosure.

FIG. 1 is a flow diagram illustrating a method for deferring ECC operations in a memory system according to some embodiments of the disclosure.

In one embodiment, the method 100 is executed by a controller of a memory system. In some embodiments, the method 100 is executed by firmware installed within the controller. In some embodiments, the method 100 is executed by a standalone processing device (e.g., a separate ECC processor). In some embodiments, the memory system involved in the method 100 comprises a DRAM memory system.

In step 102, the method operates the memory normally.

As described above, in the illustrated embodiment, the method is employed in a memory employing an inline ECC scheme. In this context, when operating normally, the memory generates ECC parity bits and stores the ECC parity bits along with the user data. As used herein, user data refers to any data stored by a processor in the memory system. In some embodiments, the ECC data is interleaved with user data. In other embodiments, the ECC data is stored in a separate ECC region of the memory bank(s) of the memory system. The particular configuration of ECC data in memory banks is not limiting and any other configuration can be used. In any scenario, the data transmitted between a controller and a memory bank when operating "normally" in step 102 includes ECC data and user data, thus partitioning the bandwidth of the data bus connecting the controller and the memory banks. While not described in detail, the normal operation of an inline ECC DRAM device includes various other operations not described herein. For example, a detailed description of specific ECC mechanisms (e.g., parity generation, hamming codes, etc.) is not provided herein but is included as part of "normal" operations of an inline ECC memory system.

In step 104, the method determines if the deferral of ECC operations has been triggered. In one embodiment, determining whether the deferral of ECC operations has been triggered comprises determining if one or more conditions have been met by the memory system.

In one embodiment, the method determines whether a processor has transmitted a command explicitly requesting the memory system defer ECC operations. In some embodiments, the method provides an external command interface and a deferral command that an application running on the processor can transmit to the memory system to proactively defer ECC operations. As one example, if the memory system is used in, for example, a media device, an application running on the processor can be configured to handle delays in error notification (e.g., by buffering data prior to outputting the data). In this example, an application (e.g., a video player) can indicate that ECC operations can be deferred. In some embodiments, the command to defer ECC operations includes a time length to defer operations. Note that such a time period is, in some embodiments, overridden by a trigger to stop deferring ECC operations in step 108.

In one embodiment, the method determines whether a utilization of a data bus exceeds a pre-configured threshold. In one embodiment, the data bus comprises a bus between the controller and the memory banks. Alternatively, or in conjunction with the foregoing, the bus includes the bus between the controller and the processor. In some embodiments, the pre-configured threshold comprises a 90% bus utilization threshold. In these embodiments, the deferral of ECC operations is synchronized with the amount of data transferred over the various busses of the memory system. Since ECC data is transported on the same bus as user data, the pre-configured threshold can be sized based on the size of the ECC data relative to the size of user data. In this manner, the threshold detects when the ECC operations are consuming too much bandwidth relative to the amount of user data transferred on the bus.

The above examples are intended to illustrate specific types of conditions in which the method defers ECC operations. Other conditions can be used in lieu of, or in combination with, these examples and the specification is not intended to be limited to simply these examples. As one example, in one embodiment, the method uses the error rate of the ECC operations to determine whether to defer ECC operations. For instance, if the error rate is low, the method can defer ECC operations temporarily. As another example, in one embodiment, the method defers ECC operations during a startup period or according to a pre-planned interval. When using a pre-planned interval, the method enables ECC operations for (as an example) 10 microseconds and then defers ECC operations for 10 microseconds, repeating this pattern indefinitely.

In some embodiments, step 104 is performed by firmware embedded within a memory controller. In this embodiment, the firmware performs the monitoring steps described above. Alternatively, in some embodiments, step 104 is performed by dedicated circuitry in the controller to enable/disable ECC operations.

As illustrated, step 104 comprises a conditional command. If the method determines that ECC instructions should not be deferred (e.g., bus utilization is low) the method continues to operate the memory normally in step 102. If, however, the method determines that the condition has been satisfied (e.g., bus utilization exceeds a preconfigured threshold), the method continues to step 106.

In step 106, the method defers ECC operations during reads, writes, and other operations accessing the data stored in memory.

Figure 2:
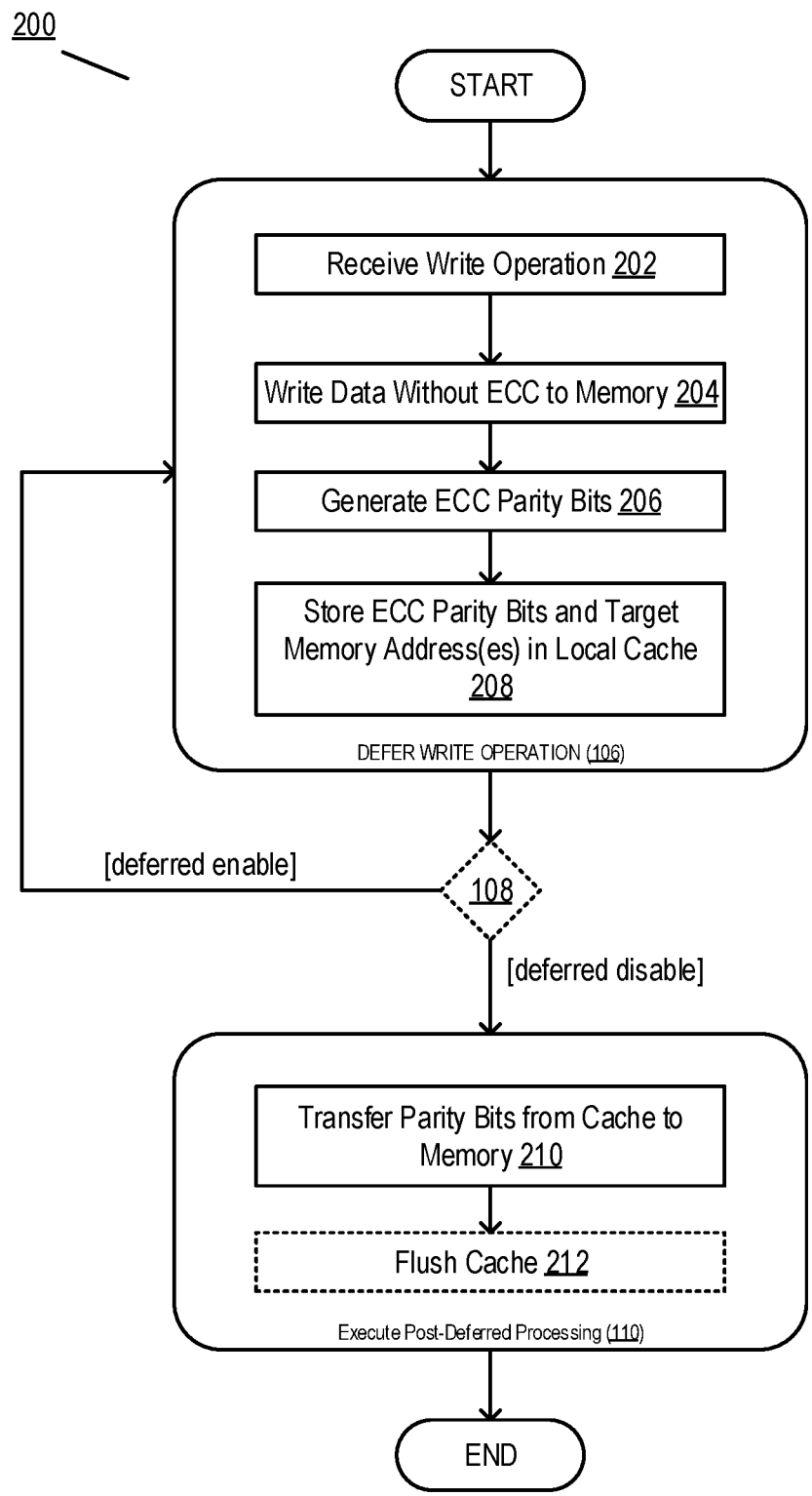
FIG. 2 is a flow diagram illustrating a method for deferring ECC operations during a memory read operation according to some embodiments of the disclosure.
Figure 3:
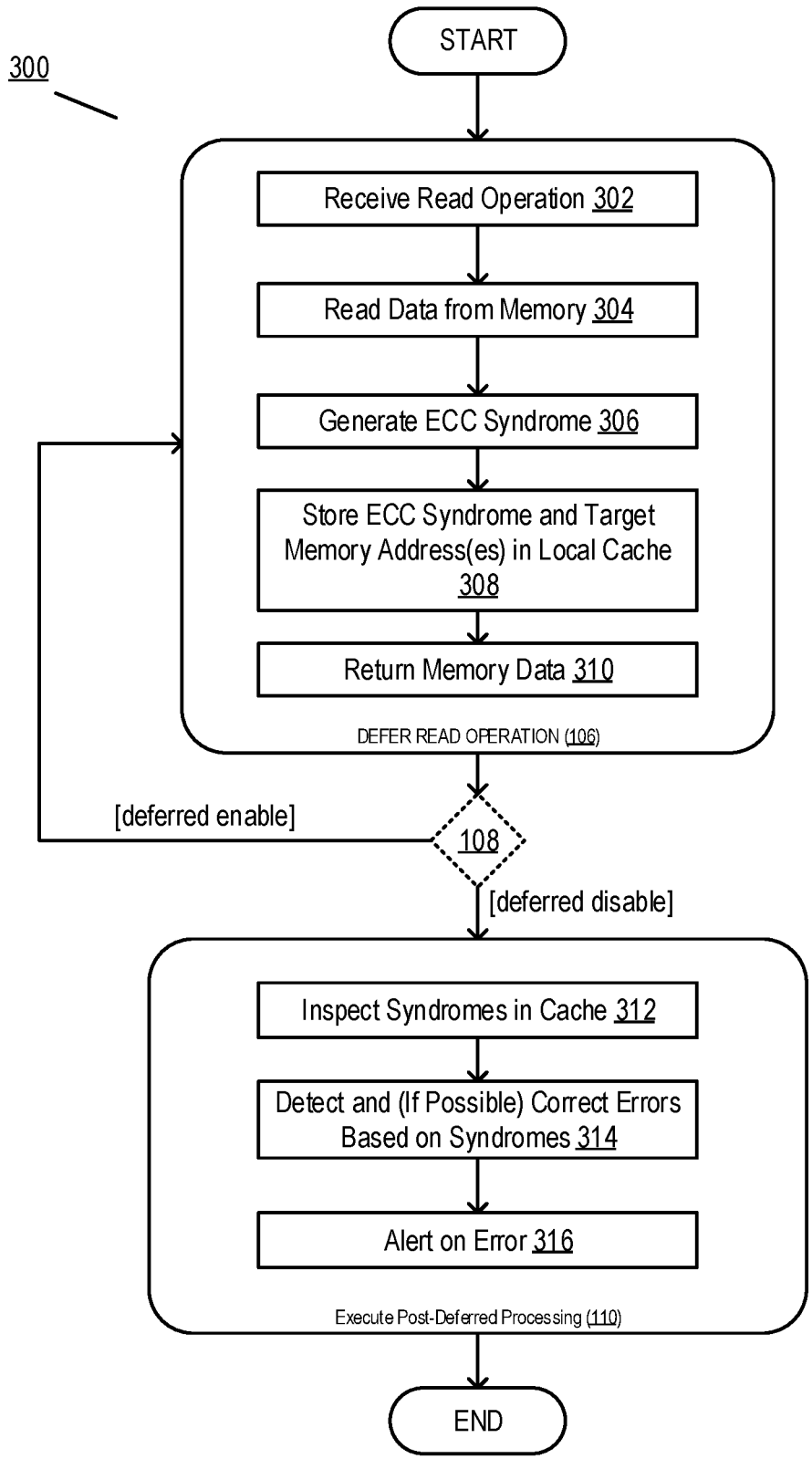
FIG. 3 is a flow diagram illustrating a method for deferring ECC operations during a memory write operation according to some embodiments of the disclosure.

The details of step 106 are described more fully in FIGS. 2 and 3 (for writes and reads, respectively) and the details of those Figures is included herein by reference in its entirety. In brief, during step 106 the method ceases the transmission of ECC data over the data buses connected to the controller. However, during this period, the controller continues to process ECC data (as will be described in FIGS. 2 and 3) for later use.

In step 108, the method determines if the deferred ECC period has expired.

As in step 104, determining whether the deferral of ECC operations has been disabled comprises determining if one or more conditions have been met by the memory system.

In one embodiment, the method determines whether a processor has transmitted a command explicitly requesting the memory system to stop deferring ECC operations. In some embodiments, the method provides an external command interface and a stop deferral command that an application running on the processor can transmit to the memory system to proactively stop deferring ECC operations. The instruction to stop deferring ECC operations is the logical inverse of the instruction to defer ECC operations, discussed in connection with step 104.

In one embodiment, the method determines whether a utilization of a data bus (discussed above) is below a pre-configured threshold. In some embodiments, the pre-configured threshold comprises a 50% bus utilization threshold. In these embodiments, the deferral of ECC operations is synchronized with the amount of data transferred over the various busses of the memory system. Since ECC data is transported on the same bus as user data, the pre-configured threshold can be sized based on the size of the ECC data relative to the size of user data. In this manner, the threshold detects when the utilization of the data bus has "freed" up after deferring ECC operations and re-enables ECC operations in response.

In another embodiment, the method determines whether a local cache memory is full (or near full) and enables ECC operations upon determining that the cache is full or nearly full. As will be described below, in some embodiments, the memory system uses a local cache memory to temporarily store ECC data that would normally be transmitted over the data busses. If this cache memory is full, or nearly full, the method can no longer continue to defer ECC operations and must flush the cache by re-enabling ECC operations (and proceeding to step 110 to fully flush the ECC data stored in cache).

The above examples are intended to illustrate specific types of conditions in which the method stops deferring ECC operations. Other conditions can be used in lieu of, or in combination with, these examples and the specification is not intended to be limited to simply these examples. As one example, in one embodiment, the method uses the error rate of the ECC operations to determine whether to stop deferring ECC operations. For instance, if the error rate is high, the method can stop deferring ECC operations (to avoid a rapid cache overflow as well as prevent fully corrupted data being returned/written). As another example, in one embodiment, the method stops deferring ECC operations according to a pre-planned interval. When using a pre-planned interval, the method enables ECC operations for (as an example) 10 microseconds and then defers ECC operations for 10 microseconds, repeating this pattern indefinitely.

In some embodiments, step 108 is performed by firmware embedded within a memory controller. In this embodiment, the firmware performs the monitoring steps described above. Alternatively, in some embodiments, step 104 is performed by dedicated circuitry in the controller to enable/disable ECC operations.

As illustrated, step 108 comprises a conditional command. If the method determines that ECC instructions should be deferred (e.g., bus utilization is high) the method continues to defer ECC operations in step 106. If, however, the method determines that the condition has been satisfied (e.g., bus utilization is below a preconfigured threshold), the method continues to step 110.

In step 110, the method executes post-deferred processing of ECC data.

The details of step 110 are described more fully in FIGS. 2 and 3 (for writes and reads, respectively) and the details of those Figures is included herein by reference in its entirety. In brief, during step 110 the method unwinds any ECC data stored in local cache during the deferred period. For reads, the method ensures that an ECC syndrome computed locally by the controller matches the ECC syndrome stored in memory. For writes, the method writes an ECC syndrome cached in the local cache to memory at the corresponding memory address.

FIG. 2 is a flow diagram illustrating a method for deferring ECC operations during a memory read operation according to some embodiments of the disclosure.

As illustrated, FIG. 2 illustrates embodiments of steps 106, 108, and 110 as briefly described above. Specifically, FIG. 2 illustrates embodiments of steps 106 and 110 performed in response to a write operation. In the illustrated embodiment, a write operation refers to memory write instruction such as an instruction to write to a DRAM memory device. The specific format of a write operation is not limiting and various alternative write operation formats can be used. In general, it can be assumed (for the purposes of FIG. 2) that a write operation includes a user data portion (data to be written to a memory device) and an address (either relative/offset or absolute). In some embodiments, the write operation has more parameters in addition to a data field and write address.

In step 202, the method receives the write operation. In some embodiments, the write operation is received over a dedicated bus. In other embodiments, the write operation is received to pin inputs of a dedicated memory controller. In one embodiment, the write operation is received by firmware in the memory controller. In other embodiments, the write operation is received by dedicated circuity in the memory controller.

In step 204, the method writes data without ECC data to the memory device.

As discussed above, existing memory controllers include ECC circuitry to generating ECC data during each write. This ECC data is then stored in the DRAM memory along with the user data. In step 204, the method disables this ECC circuitry and writes only the user data to the memory device. In some embodiments, step 204 comprises raising a disable bit or flag on the ECC circuitry. In other embodiments, step 204 comprises disabling a subroutine executed by the firmware that performs the ECC code generation.

In step 206, the method generates ECC parity bits for the data written to memory.

In some embodiments, the method utilizes existing ECC encoding schemes to generate the parity bits in step 206. For instance, in one embodiment, the method uses a Hamming code (e.g., a 7,4 Hamming code) to generate parity bits for received data.

In some embodiments, the method uses existing ECC hardware to generate parity bits for user data to write to the memory device. In some embodiments, the method generates the ECC parity bits in parallel with writing the data to memory. In other embodiments, the method generates the ECC parity bits before writing the data to memory. In some embodiments, the method buffers the generation of ECC parity bits while streamlining writes to memory.

In step 208, the method stores the ECC parity bits and target addresses in a local cache memory.

In one embodiment, a memory controller includes, or is communicatively coupled to, a small cache memory (such as static DRAM device). In step 208, the method stores the parity bits generated in step 206 to this cache. In addition, the method stores the target addresses to the cache. The target addresses correspond to the write addresses in the write operations. In some embodiments, the method stores the write addresses used to write the user data to the memory in the event that the received addresses are modified prior to writing to the underlying memory system.

As discussed in FIG. 1, the method continues to execute step 106 (steps 202-208) until determining (step 108) that ECC operations should no longer be deferred. Upon reaching that determining, the method executes post-deferred processing steps 210 and 212 for all write operations received during step 106.

In step 210, the method transfers the ECC parity bits from the cache to the memory.

In one embodiment, the cache stores memory addresses and parity bits for these memory addresses. In one embodiment, the method modifies the user data at a memory location to include the parity bits. In other embodiments, the method computes a parity target address using the target address stored in the cache (if the parity portion of a memory device is stored separate from the user data). In either event, the method obtains the cached parity bits and an address in the memory device in which to write the parity bits.

The method then writes the parity bits to the identified location in memory. In this manner, the method "restores" the memory to a standard ECC memory configuration. Thus, existing circuitry can be re-enabled and the ECC memory can be operated in a standard fashion.

Note that in some embodiments, write errors may occur during step 204. In some embodiments, the method ignores write errors or, alternatively, caches these errors during the deferred processing mode (step 106). If so, the method raises these write errors during step 210. In some alternative embodiments, the method may immediately raise write errors.

In step 212, the method flushes the cache.

In some embodiments, step 212 is optional. If step 212 is not implemented, the method operates the cache in a traditional manner. For example, the method can operate the cache as a least-recently used (LRU), least frequently used (LFU), first-in first-out (FIFO) cache or according to other cache replacement policies. However, in some embodiments, the method flushes the cache after executing all post-deferred processing. Note that in these embodiments, the "flushing" of the cache refers to the flushing of data stored to support unwinding the operations performed in step 106. That is, the method does not flush the entire cache but rather cleans up the data required to execute step 110.

FIG. 3 is a flow diagram illustrating a method for deferring ECC operations during a memory write operation according to some embodiments of the disclosure.

As illustrated, FIG. 3 illustrates embodiments of steps 106, 108, and 110 as briefly described above. Specifically, FIG. 3 illustrates embodiments of steps 106 and 110 performed in response to a read operation. In the illustrated embodiment, a read operation refers to memory read instruction such as an instruction to read from a DRAM memory device. The specific format of a read operation is not limiting and various alternative read operation formats can be used. In general, it can be assumed (for the purposes of FIG. 3) that a read operation includes an address (either relative/offset or absolute) to read from memory. In some embodiments, the read operation has more parameters in addition to an address.

In step 302, the method receives a read operation. In some embodiments, the read operation is received over a dedicated bus. In other embodiments, the read operation is received at pin inputs of a dedicated memory controller. In one embodiment, the read operation is received by firmware in the memory controller. In other embodiments, the read operation is received by dedicated circuity in the memory controller.

In step 304, the method read data from the memory device, the data includes both user data and ECC parity bits generated during a write.

In step 306, the method generates an ECC syndrome for the data read from memory.

In one embodiment, the method applies a parity check matrix to the memory data to generate the syndrome. The syndrome comprises a bit string indicating whether errors have occurred. A syndrome is all zeros if no errors have occurred and includes ones if errors have occurred. In general, the method utilizes a syndrome table to map syndrome bit strings to error corrections, speeding up error correction. The specific details of syndrome decoding are known in the art and detail regarding these decoding techniques are not included herein.

In step 308, the method stores the syndrome and target addresses in a local cache memory.

Unlike existing memories, the method does not attempt to correct errors before returning data to the host processor (step 319). Instead, the method stores the syndrome and the target addresses associated with the syndrome in a local cache memory (discussed above) for later use. In some embodiments, the method may discard addresses with a syndrome of all zeros, as this indicates a successful read. In the illustrated embodiments, the cache only includes the memory addresses and syndrome bits and thus does not require significant storage since the user data is not stored in cache.

In step 310, the method returns the data to the processor that issued the read operation. This may be done according to a well-defined interface as known in the art. Notably, however, no error correction has been performed on the data returned in step 310 and thus, potential errors may be present in the return data. As will be discussed, these errors are detected and, if possible, corrected in step 110.

As discussed in FIG. 1, the method continues to execute step 106 (steps 302-310) until determining (step 108) that ECC operations should no longer be deferred. Upon reaching that determining, the method executes post-deferred processing steps 312 and 314 for all read operations received during step 106.

In step 312, the method inspects any syndromes present in the cache.

As described above, in some embodiments, the method only stores syndromes for read data that includes one or more errors. In alternative embodiments, however, the cache includes syndromes for data that includes no errors. In either case, the method identifies all of the syndromes in the cache that indicate the presence of an error.

As part of step 312, the method retrieves the memory addresses associated with the syndromes that represent an error. The method then retrieves the user data and ECC data from the memory devices based on these addresses.

In step 314, the method detects and (if possible) corrects the errors using the syndromes in cache.

The syndromes stored in cache can be compared to a parity check matrix used to generate the data read from memory. By comparing the syndromes to the parity check matrix, the method identifies one or more bits containing errors in the data stored in memory.

In some embodiments, the method further computes a second syndrome using the data returned from memory. The method then compares the second syndrome to the syndrome stored in cache. If the syndromes do not match, the method flags the read result as an error.

In step 316, the method alerts the receiving device upon detecting an error with a deferred read operation.

In one embodiment, the method transmits a signal indicating a read error on a dedicated interrupt line. This signal causes the receiving processor to halt operations and handle the interrupt to retrieve the error-corrected data associated with the target address of the error-containing data.

In another embodiment, the method records the addresses of reads containing errors into a special register (or register file). In this embodiment, the processor (or other host) periodically polls the special register when the memory controller is not in a deferred mode to detect read errors.

Figure 4:
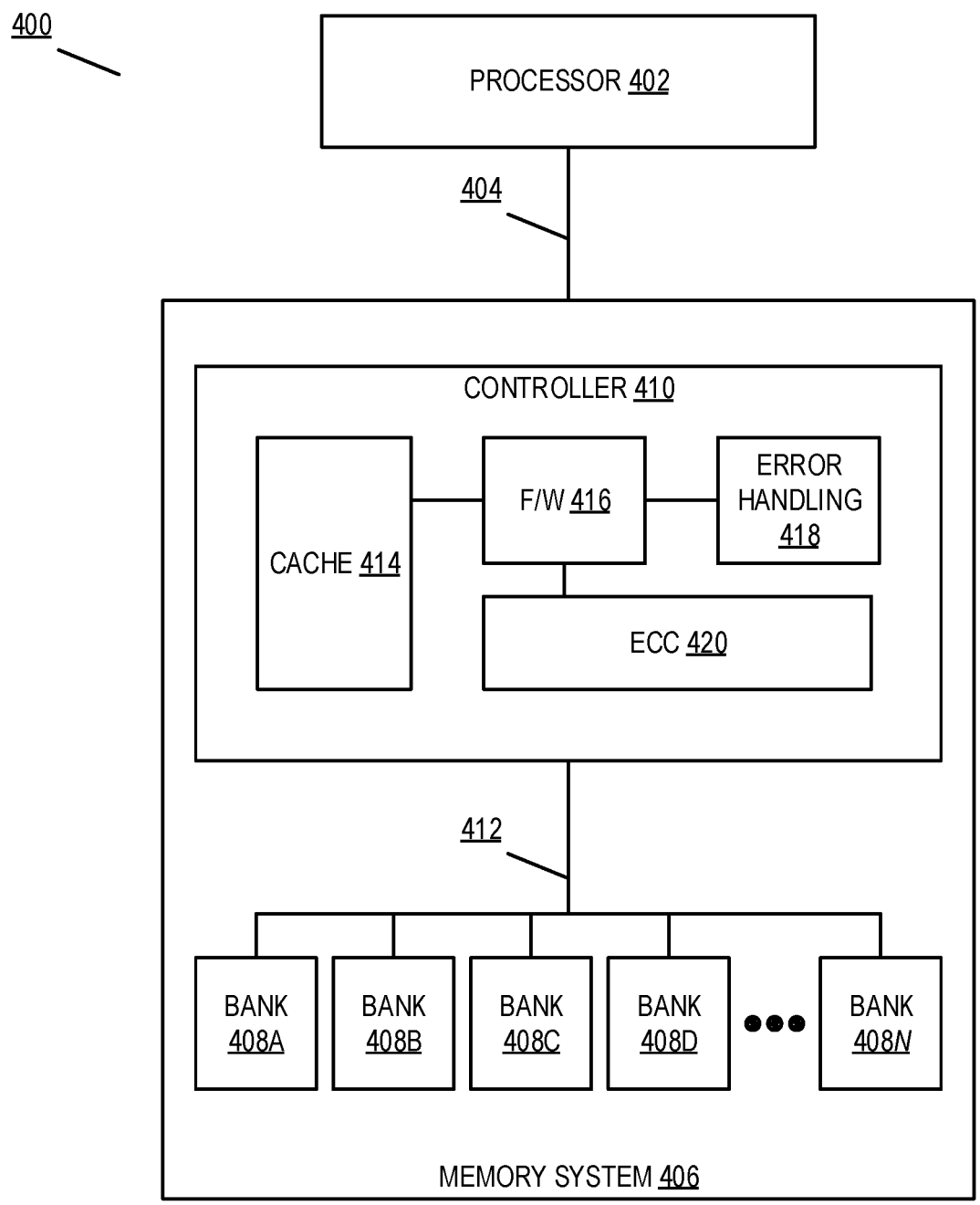
FIG. 4 is a block diagram illustrating a memory system according to some embodiments of the disclosure.

FIG. 4 is a block diagram illustrating a memory system according to some embodiments of the disclosure.

As illustrated in FIG. 4, a computing system (400) includes a processor (402) communicatively coupled to a memory system (406) via a bus (404). The memory system (406) comprises a controller (410) communicatively coupled to one or more memory banks (408A-N) via a bus/interface (412). As illustrated, the controller (410) includes a local cache (414), firmware (416), error handling modules (418), and ECC module (420).

In the illustrated embodiment, processor (402) can comprise any type of computing processor such as a central processing unit, graphics processing unit, or other type of general or special-purpose computing device. Processor (402) includes one or more output ports that allow for the transmission of address, user, and control data between processor (402) and the memory system (406). In the illustrated embodiment, this communication is performed over bus (404). In one embodiment, the bus (404) comprises an input/output (I/O) bus or similar type of bus.

The memory system (406) is responsible for managing one or more memory banks (408A-408N). In one embodiment, the banks (408A-408N) comprise DRAM banks, for example, situated on a dual inline memory module (DIMM). In other embodiments, the banks (408A-408N) comprise NAND Flash dies or other configurations of non-volatile memory.

The banks (408A-408N) are managed by the controller (410). In some embodiments, the controller (410) comprises a computing device configured to mediate access to and from memory banks (408A-408N). In one embodiment, the controller (410) comprises an ASIC or other circuitry installed on a printed circuit board housing the banks (408A-408N). In some embodiments, the controller (410) may be physically separate from the banks (408A-408N). Controller (410) communicates with the banks (408A-408N) over interface (412). In some embodiments, this interface (412) comprises a physically wired (e.g., traced) interface. In other embodiments, the interface (412) comprises a standard bus for communicating with banks (408A-408N).

Controller (410) comprises various modules (414-420). In one embodiment, the various modules (414-420) comprise various physically distinct modules or circuits. In other embodiments, the modules (414-420) may completely (or partially) be implemented in software or firmware.

As illustrated, firmware (416) comprises the core of the controller and manages all operations of the controller. Thus, firmware (416) mediates all access to banks (408A-408N). During non-deferred operation, firmware (416) receives write operations and forwards the data to ECC module (420). ECC module (420) generates parity bits for the write data and firmware (416) writes the encoded data to banks (408A-408N). Similarly, during read operations, firmware (416) retrieves data and parity bits from the banks (408A-408N) and error checks/corrects the data by forwarding the retrieved data to ECC (420) and receiving the error corrected codeword from ECC (420).

During deferred operation, firmware (416) bypasses the ECC module (420) when accessing banks (408A-408N). During writes, the firmware (416) directly writes user data to the memory banks (408A-408N) while generating the parity bits out-of-band using the ECC (420). The firmware (416) then writes the parity bits to cache (414) and maps the address of the write to the parity bits. The cache (414) comprises a low-latency storage device such as an SDRAM chip or similar storage mechanism. During read operations, the firmware (416) retrieves the data from banks (408A-408N) and returns the data to processor (402) over bus (404). Simultaneously, the firmware (416) forwards the read data to ECC (420) which returns a syndrome. The firmware (416) stores this syndrome (and the associated address) in cache (414).

Upon exiting a deferred mode, the firmware (416) writes the parity data stored in cache (414) for each write operation in the memory banks (408A-408N). For read operations, the method re-reads the data from banks (408A-408N), re-computes the syndrome, and compares the two syndromes (including the one stored in cache (414)) to determine if a read error occurred. If, in either scenario, an error occurs, the firmware (416) forwards the address to error handling code (418) which can raise an interrupt on processor (402) or store the error in a special register (not illustrated). In addition to the foregoing, firmware (416) is configured to monitor the status of the memory system (406) to determine when the memory system (406) should enter deferred mode.

These and other operations performed by the controller (410) are described in more detail in FIGS. 1 and 3. For the sake of completeness, the controller (410) is configured to perform any and all operations discussed previously but not restated in connection with FIG. 4.

The present disclosure has been described more fully hereinafter with reference to the accompanying drawings, which form a part hereof, and which show, by way of illustration, certain example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used above may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

The present disclosure has been described with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a general-purpose processor, a special-purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a computer-readable medium (or computer-readable storage medium/media) stores computer data, which data can include computer program code (or computer-executable instructions) that is executable by a computer, in machine-readable form. By way of example, and not limitation, a computer-readable medium may comprise computer-readable storage media, for tangible or fixed storage of data, or communication media for transient interpretation of code-containing signals. Computer-readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer-readable storage media includes, but is not limited to, RAM, ROM, EPROM, EEPROM, flash memory or other solid-state memory technology, CD-ROM, DVD, or other optical storage, magnetic cassettes, magnetic tape, magnetic disk storage or other magnetic storage devices, or any other physical or material medium which can be used to tangibly store the desired information or data or instructions and which can be accessed by a computer or processor.

What is claimed is:

1. A method comprising:
    starting a deferred period of operation of a memory system in response to detecting a satisfaction of a condition, wherein, during the deferred period of operation, an error code correction (ECC) portion of a memory bank is not accessed during operations;
    issuing a command to read data from or write data to the memory bank of the memory system in response to an operation received from a processor during the deferred period of operation;
    generating ECC data prior to receiving a response to the command from the memory bank during the deferred period of operation;
    caching the ECC data in a local cache; and
    returning a result of the command to the processor while the ECC data is present in the local cache.

2. The method of claim 1, further comprising:
    receiving the operation during the deferred period, the operation comprising a read or write operation access one or more memory banks of the memory system; and
    executing the operation prior to issuing the command to the memory bank of the memory system.

3. The method of claim 1, the detecting the satisfaction of the condition comprising detecting one of:
    a receipt of a second command to start the deferred period from the processor; or
    a data bus utilization above a predetermined threshold.

4. The method of claim 2, the operation comprising a write operation and the generating ECC data comprising:
    generating ECC parity bits based on data in the write operation; and
    storing the ECC parity bits and an address associated with the data in the local cache.

5. The method of claim 4, further comprising writing the ECC parity bits to the memory bank using the address.

6. The method of claim 2, the operation comprising a read operation and the generating ECC data comprising generating an ECC syndrome based on data in the read operation; and storing the ECC syndrome and an address associated with the data in the local cache.

7. The method of claim 6, further comprising:
    detecting a mismatch using the ECC syndrome; and
    in response to detecting the mismatch, alerting the processor that an error executing the read operation occurred.

8. The method of claim 1, further comprising:
    detecting an end of the deferred period of operation; and
    executing ECC operations after the end of the deferred period.

9. The method of claim 8, the detecting the end of the deferred period comprising detecting one of: a receipt of a third command to stop the deferred period from the processor; a data bus utilization below a predetermined threshold; or the local cache is full.

10. A non-transitory computer-readable storage medium for tangibly storing computer program instructions capable of being executed by a computer processor, the computer program instructions defining steps of:
    starting a deferred period of operation of a memory system in response to detecting a satisfaction of a condition, wherein, during the deferred period of operation, an error code correction (ECC) portion of a memory bank is not accessed during operations;
    issuing a command to read data from or write data to the memory bank of the memory system in response to an operation received from a processor during the deferred period of operation;
    generating ECC data prior to receiving a response to the command from the memory bank during the deferred period of operation;
    caching the ECC data in a local cache; and
    returning a result of the command to the processor while the ECC data is present in the local cache.

11. The non-transitory computer-readable storage medium of claim 10, the computer program instructions further defining steps of:
    receiving the operation during the deferred period, the operation comprising a read or write operation access one or more memory banks of the memory system; and
    executing the operation prior to issuing the command to the memory bank of the memory system.

12. The non-transitory computer-readable storage medium of claim 10, the detecting the satisfaction of the condition comprising detecting one of:
    a receipt of a second command to start the deferred period from the processor; or
    a data bus utilization above a predetermined threshold.

13. The non-transitory computer-readable storage medium of claim 10, the operation comprising a write operation and the generating ECC data comprising:
    generating ECC parity bits based on data in the write operation; and
    storing the ECC parity bits and an address associated with the data in the local cache.

14. The non-transitory computer-readable storage medium of claim 10, the operation comprising a read operation and the generating ECC data comprising generating an ECC syndrome based on data in the read operation; and storing the ECC syndrome and an address associated with the data in the local cache.

15. A memory system comprising:
    a plurality of memory banks;
    a bus connected to the memory banks; and
    a controller connected to the bus, the controller configured to perform operations of:
        starting a deferred period of operation of a memory system in response to detecting a satisfaction of a condition, wherein, during the deferred period of operation, an error code correction (ECC) portion of a memory bank is not accessed during operations;
        issuing a command to read data from or write data to the memory bank of the memory system in response to an operation received from a processor during the deferred period of operation;
        generating ECC data prior to receiving a response to the command from the memory bank during the deferred period of operation;
        caching the ECC data in a local cache; and
        returning a result of the command to the processor while the ECC data is present in the local cache.

16. The memory system of claim 15, the operations further comprising:
    receiving the operation during the deferred period, the operation comprising a read or write operation access one or more memory banks of the memory system; and
    executing the operation prior to issuing the command to the memory bank of the memory system.

17. The memory system of claim 15, the detecting the satisfaction of the condition comprising detecting one of:

a receipt of a second command to start the deferred period from the processor; or a data bus utilization above a predetermined threshold.

18. The memory system of claim 15, the operation comprising a write operation and the generating ECC data comprising:

generating ECC parity bits based on data in the write operation; and storing the ECC parity bits and an address associated with the data in the local cache.

19. The memory system of claim 18, further comprising writing the ECC parity bits to the memory bank using the address.

20. The memory system of claim 15, the operation comprising a read operation and the generating ECC data comprising generating an ECC syndrome based on data in the read operation; and storing the ECC syndrome and an address associated with the data in the local cache.

* * * * *